United States Patent
Song et al.

[19]

[11] Patent Number: 5,959,906
[45] Date of Patent: Sep. 28, 1999

[54] SEMICONDUCTOR MEMORY DEVICE WITH A FULLY ACCESSIBLE REDUNDANT MEMORY CELL ARRAY

[75] Inventors: Ho-sung Song; Jong-hyun Choi, both of Kyungki-do, Rep. of Korea

[73] Assignee: Samsung Electronics, Co., Ltd, Suwon, Rep. of Korea

[21] Appl. No.: 08/977,844

[22] Filed: Nov. 25, 1997

[30] Foreign Application Priority Data

Dec. 5, 1996 [KR] Rep. of Korea ................. 96-62130

[51] Int. Cl.[6] ........................................ G11C 7/00
[52] U.S. Cl. ................................ 365/200; 365/225.7
[58] Field of Search .......................... 365/200, 225.7, 365/230.03

[56] References Cited

U.S. PATENT DOCUMENTS 5,386,386  1/1995  Ogihara ........................... 365/200
5,708,619  1/1998  Gillingham ....................... 365/200
5,768,198  6/1998  Moroo ............................. 365/200

Primary Examiner—Son T. Dinh
Attorney, Agent, or Firm—Marger Johnson & McCollom P.C.

[57] ABSTRACT

A semiconductor memory device is shown that includes a normal memory cell array including a plurality of memory cells specified by $2^n$ word lines and a plurality of column bit lines where an externally input n-bit row address is decoded to activate one of the $2^n$ word lines. The semiconductor memory device further includes a redundant row fuse decoder that includes a plurality of n-bit address fuse portions each of which can be selectively coded to respond to an n-bit defective row address value in the externally input n-bit row address which corresponds to a word line in the normal memory cell array that includes a defective memory cell. The semiconductor memory device further includes a redundant memory cell array including a plurality of rows of memory cells which can be activated by one of the n-bit address fuse portions in response to the defective row address coded into the n-bit address fuse portion.

7 Claims, 10 Drawing Sheets

SEMICONDUCTOR MEMORY DEVICE WITH A FULLY ACCESSIBLE REDUNDANT MEMORY CELL ARRAY

BACKGROUND OF THE INVENTION

1. Field of the Invention

The present invention relates to a semiconductor memory device and, more particularly, to a semiconductor memory device having a redundant memory cell array.

2. Description of the Related Art

FIG. 1 is a block diagram of a conventional semiconductor memory device having a redundant memory cell array 108. In FIG. 1, a row address buffer 101 latches an n-bit row address RA that is input to the semiconductor memory device by an external device when a row address strobe signal RASB, that is buffered by a row address strobe buffer 110, is strobed by the external device. The row address strobe buffer 110 is synchronized with a system clock to buffer the externally applied row address strobe signal RASB. A control signal generator 109 delays the buffered RASB signal output from the row address strobe buffer 110 by a predetermined period of time in order to generate a delayed row address strobe signal RASBD.

A normal memory cell array 106 is composed of a plurality of memory cells arranged in a matrix pattern. Each memory cell can be accessed by the combination of a normal word line and a bit line. Where the row address RA is composed of n bits, the number of individually driven normal word lines included in the memory cell array 106 should be less than $2^n$. Each one of the normal word lines included in the memory cell array 106 is selectively activated by a corresponding value of the row address RA.

Row address decoding is performed in order to select one of the word lines of normal memory cell array 106. The row address decoding related to the normal memory cell array 106 is performed by a row predecoder 102 and a row decoder 105. Here, the row predecoder 102 receives (n-k) bits of the n row address bits output by row address buffer 101 while the remaining k bits are passed through to row decoder 105. The row predecoder 102 decodes the (n-k) bits of the row address and outputs the result as predecoder row address signal PRA, which is composed of $2^{(n-k)}$ signals. The signal PRA and the remaining k bits of row address RA are applied to the row decoder 105. The row decoder 105 includes $2^{(n-k)}$ k-bit decoders which each decode the remaining k bits and control a corresponding one of $2^{(n-k)}$ normal word line drivers. The $2^{(n-k)}$ k-bit decoders are enabled by the PRA signal output by the row predecoder 102. Thus, the row address decoding function is performed by the row predecoder 102 along with the k-bit decoders included in row decoder 105. The normal word line drivers included in the row decoder 105 are enabled or disabled in response to the signal PRRE output by row decoder disable signal generator 103 and the control signal RASBD and, responsive to the decoded row address RA, drive one of the $2^n$ normal word lines of the normal memory cell array 106 which are coupled to the row decoder 106.

The memory device of FIG. 1 also includes redundant memory cell array 108 which is used to replace defective memory cells which may occur in the normal memory cell array 106. Each memory cell included in the redundant memory cell array 108 is accessible through the combination of a redundant word line and a bit line.

The size of the redundant memory cell array 108 is determined during design thereof based upon the probability that defects will be generated during the manufacturing process. A row address for driving each redundant word line is not determined during the design of the memory device but during a repair phase after the memory device has been fabricated. The row address decoding for the redundant memory cell array 108 is performed by a redundant row fuse decoder 104 and a redundant row decoder 107. The redundant row fuse decoder 104 receives m bits of the row address output from the row address buffer 101, while the remaining (n-m) bits of the row address RA are passed through to the redundant row decoder 107.

Referring to FIG. 2, the redundant row fuse decoder 104 is composed of a plurality of m-bit address fuse portions 121, 122 and 123. The ellipses in the drawing indicate that more m bit address fuse portions can be included in a particular circuit design. The m-bit address fuse portions 121, 122 and 123 each decode m bits of a row address corresponding to word line in the normal memory cell array 106 that contains a defective memory cell. For example, when the row address RA that specifies a normal word line in the normal memory cell array 106 is composed of 11 bits, the number of bits m decoded in each address fuse portion is 7. Thus, when the row address corresponding to a word line containing a defective memory cell (which are hereinafter referred to as defective row addresses) is 10010111000, then the m-bit address fuse portion is coded using the lower 7 bits, i.e. 0111000.

The coding of the defective row addresses is performed by selectively shorting the fuse array in one of the m bit address fuse circuits 121, 122 or 123 to decode the selected defective address. In such a scheme, all the word lines in the normal memory cell array 106 having the same value for the upper (n-m) bits of the row address are grouped together. Only the defective memory cells within a group can be repaired. For example, when n=11 there are $2^{11}$ normal word lines which can be divided into 24 groups according to the row addresses thereof. Namely, the row address RA can be classified into the groups (00000000000)-(00001111111), (00010000000)-(00011111111), (00100000000)-(00101111111), (00110000000)-(00111111111), . . . , (11110000000)-(11111111111).

Groups which do not have a corresponding m bit address fuse portion 121, 122 or 123 cannot be repaired. For example, if the group in which the upper 4 bits of the row address is (1001) is not assigned an m bit address fuse portion, then defects occurring in the word lines of the normal memory cell array 106 in which the row address of the upper 4 bits is (1001) cannot be repaired.

Furthermore, each m bit address fuse portion 121, 122 and 123 can only decode one word line in a group. Thus, if defects occur in two memory cells in the same normal word line, the two defective memory cells can both be repaired. However, if defects occur in two different word lines in the same group, then both the defective word lines cannot be replaced. For example, if a defective memory cell occurs in the word line with the row address (10010111000) and another defective memory cell occurs in the word line with the row address (10010100110), then only one of the defective cells can be replaced. In this scheme, defective memory cells can occur that may not be replaced even though a usable redundant memory cell in redundant memory cell array 108 exists.

In FIG. 2, the outputs RED1, RED2, . . . , REDi of m-bit address fuse portions 121, 122 and 123 are activated responsive to an m bit defective row address of the row address signal RA that has been coded into the fuse portion. An (n-m)-bit decoder 130 included in the redundant row decoder 107 decodes the remaining higher order (n-m) bits of the row addresses RA and outputs a signal responsive to each group of (n-m) bits in the row address signal RA. Logic gates 141, 142 and 143 combine the output signals from the (n-m) bit decoder 130 with the output of each of the m-bit address fuse portions 121, 122 and 123. More specifically, the logic gate 141 combines the first output of the (n-m)-bit decoder 130 and the RED1 signal and generates an output signal when both inputs are active. Similarly, logic gate 142 combines the second output of the (n-m)-bit decoder 130 and the RED2 signal. And logic gate 143 combines the last output of the (n-m)-bit decoder 130 and the REDi signal. Thus, for example, the logic gate 141 is activated when the upper 4-bits of the row address signal RA is (0000) and RED1 is active, the logic gate 142 is activated when the upper 4-bits of the row address signal RA is (0001) and RED2 is active, and the logic gate 143 is activated when the upper 4-bits of the row address signal RA is (1111) and the REDi is active.

Logic gates 151, 152 and 153 transmit the outputs of the logic gates 141, 142 and 143, respectively, to the corresponding redundant word line drivers 161, 162 and 163, respectively, when the delayed row address strobe signal RASBD is active. Redundant word line drivers 161, 162 and 163 output signals which drive the corresponding redundant word lines R-WL(1), R-WL(2), ..., R-WL(I), respectively, when the corresponding output signal from one of logic gates 141, 142 or 143 is active.

Returning to FIG. 1, a column address strobe buffer 111 receives a column address strobe signal CASB in synchronization with the system clock. A column address buffer 113 latches an externally input column address signal CA when strobed by the column address strobe signal CASB. A column decoder 112 decodes the column address CA and generates a column line select signal which enables the column select line corresponding to the value of the column address signal CA.

The row decoder disable signal generator 103 generates the row decoder disable signal PRRE which is activated when one of the outputs of the redundant row fuse decoder 104 is active. The row decoder 105 is disabled so that it does not perform a decoding operation when the row decoder disable signal PRRE is active.

The conventional semiconductor memory device described above suffers from the problem that a defective memory cell in normal memory cell array 106 cannot be replaced even though a replacement cell in redundant memory cell array 108 is available because more than one row has a defective memory cell within the same group. The memory device above also runs into problems with slower operating speed and increased chip layout area require for the circuit design.

SUMMARY OF THE INVENTION

It is an object of the present invention to provide a semiconductor memory device in which the speed of the redundant memory cell addressing operation is improved.

It is another object of the present invention to provide a semiconductor memory device having a redundant memory cell array in which the layout area for the circuit is reduced.

To achieve the above objects, there is provided a semiconductor memory device according to the present invention which includes a normal memory cell array including a plurality of memory cells organized into $2^n$ word lines and a plurality of column bit lines. The device also includes a normal row address decoder configured to activate one of the word lines of the normal memory cell array responsive to an externally input n-bit row address signal, wherein the normal row address decoder is further configured to be inhibited from activating one of the $2^n$ word lines of the normal memory cell array responsive to a normal row decoder disable signal. A redundant row fuse decoder is included which has a plurality of n-bit address fuse portions wherein each one of the plurality of n-bit address fuse portions is configured to be coded to respond to an n-bit defective row address in the externally input n-bit row address signal corresponding to one of the $2^n$ word lines of the normal memory cell array and generate an redundant word line activation signal, and wherein the redundant row fuse decoder is further configured to generate the normal row decoder disable signal responsive to the redundant word line activation signal. The device further includes a redundant memory cell array including a plurality of redundant rows of memory cells specified by a redundant word line and the plurality of column bit lines, wherein each one of the redundant rows of memory cells is configured to receive the redundant word line activation signal generated by one of the n-bit address fuse portion of the redundant row fuse decoder.

An embodiment of a method according to the present invention for replacing defective memory cells in a normal memory cell array having $2^n$ rows includes providing a redundant memory cell array, specifying a predetermined n-bit defective row address by selectively blowing fuses in an n-bit redundant row address decoder, and decoding the predetermined n-bit defective row address from an externally input n-bit row address signal. The method also involves disabling the activation of the rows of the normal memory cell array responsive to decoding the predetermined n-bit defective row address from the externally input n-bit row address signal, and activating a row of the redundant memory cell array responsive to decoding the predetermined n-bit defective row address from the externally input n-bit row address signal

BRIEF DESCRIPTION OF THE DRAWINGS

In the attached drawings, like elements are given the same or similar reference numbers in order to indicate their relationship to one another.

DESCRIPTION OF THE PREFERRED EMBODIMENTS

The present invention will now be described in detail with reference to the attached drawings.

Figure 3:
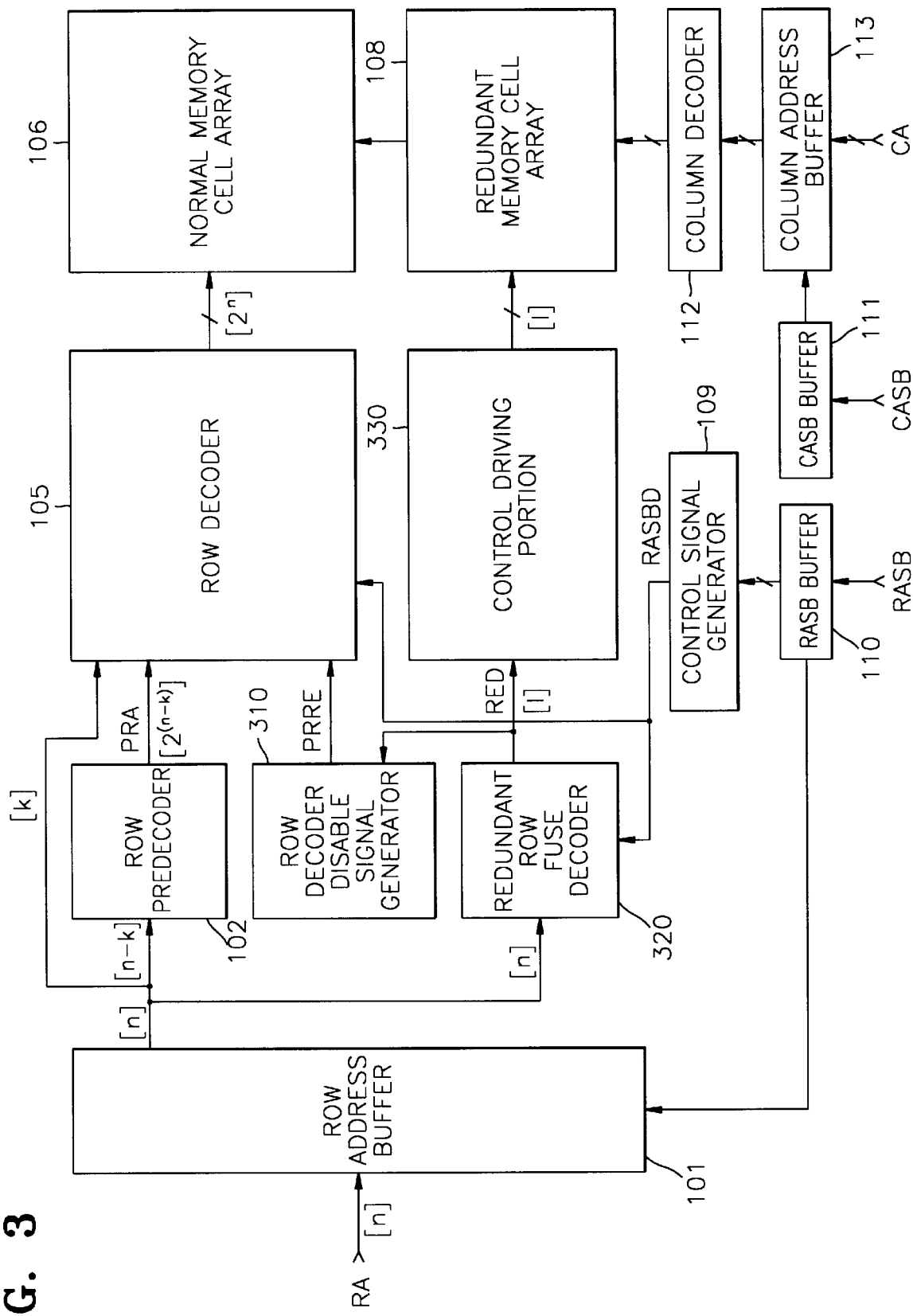
FIG. 3 is a block diagram of a semiconductor memory device according to the present invention.

FIG. 3 is a block diagram of an embodiment of a semiconductor memory device according to the present invention. Similar to the conventional memory device of FIG. 1, the memory device of the present invention includes a row address buffer 101, a row predecoder 102, a row decoder 105, a normal memory cell array 106, a redundant memory cell array 108, a control signal generator 109, a row address strobe buffer 110, a column address strobe buffer 111, a column address buffer 113 and a column decoder 112. The memory device of the present invention further includes a row decoder disable signal generator 310, a redundant row fuse decoder 320 and a control driving portion 330.

As in the conventional memory device, the row address strobe buffer 110 synchronizes the externally input row address strobe signal RASB with the system clock by latching the signal RASB responsive to a system clock. The row address buffer 101 synchronizes the externally input n bit row address signal RA with the system clock by latching the row address signal RA responsive to the buffered RASB signal output from RASB buffer 110. The column address strobe buffer 111 synchronizes the externally input column address strobe signal CASB with the system clock by latching the CASB signal responsive to the system clock. The column address buffer 113 synchronizes the externally input column address CA with the system clock by latching the column address CA responsive to the buffered column address strobe signal CASB output from the CASB buffer 111. The column decoder 112 decodes and outputs the column address CA. An I/O port (not shown), that is also controlled by the decoded column address, is connected between the column lines of the normal memory cell array 106 and the redundant memory cell array 108, which also correspond to bit lines, and the input/output pins of the circuit.

As with the conventional memory device, the normal memory cell array 106 is composed of a plurality of memory cells arranged in a matrix pattern. Each memory cell is accessed by the combination of the row address RA decoded by the row predecoder 102 and the row decoder 105 and the column or bit line address CA decoded by column decoder 112.

Figure 4:
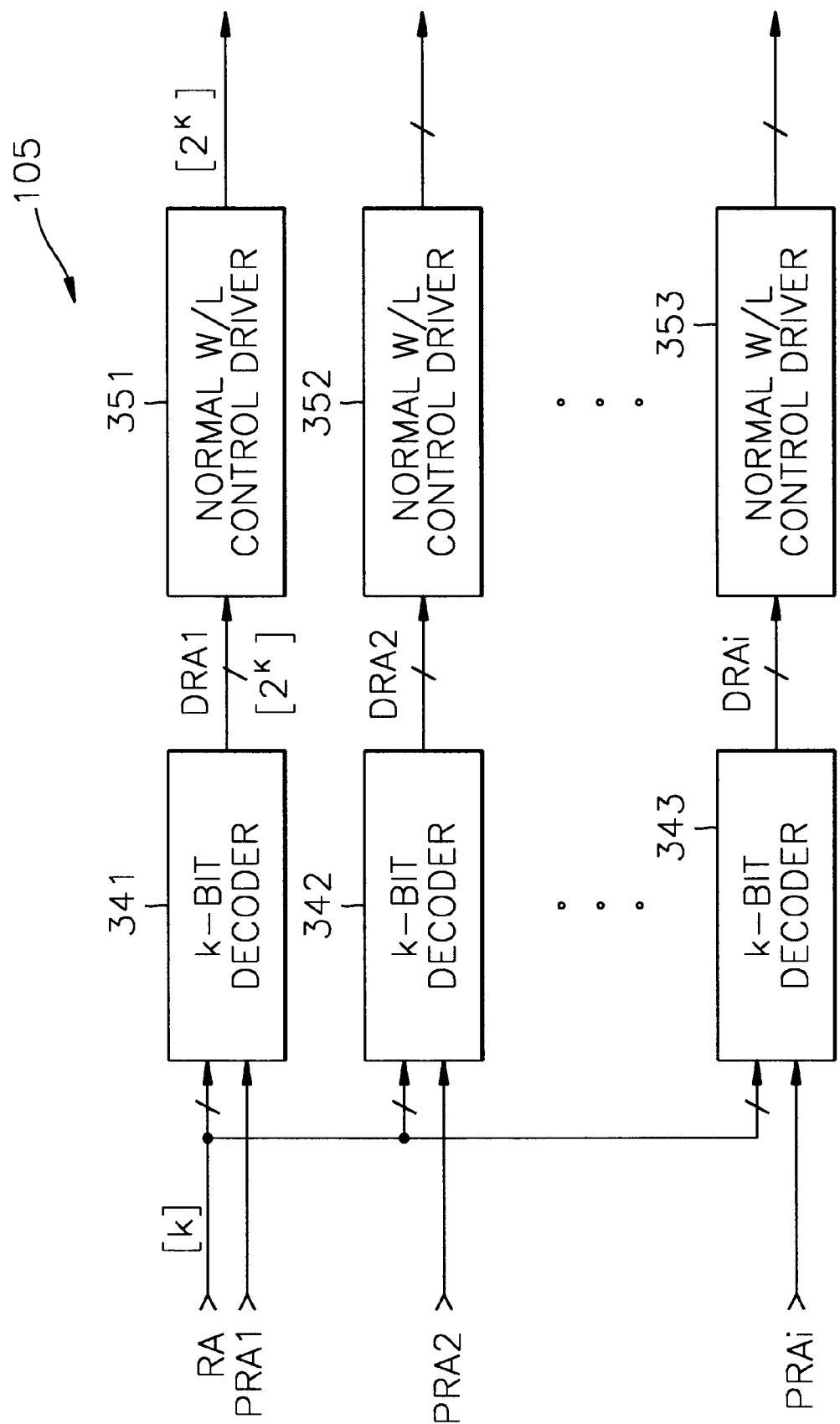
FIG. 4 is a detailed block diagram of the row decoder of FIG. 3.

FIG. 4 shows the row decoder 105 which includes a plurality of k-bit decoders 341, 342 and 343 and a plurality of normal word line control driving portions 351, 352 and 353. The k-bit decoders 341, 342 and 343 each perform the decoding function for the lower order k bits of the row address RA and are selectively enabled by a corresponding output signal PRA1, PRA2, . . . , PRAi from the row predecoder 102 which performs the decoding function on the upper (n-k) bits of the row address RA value in order to select one of the k-bit decoders 341, 342 and 343.

The normal word line control driving portions 351, 352 and 353 drive a corresponding normal word line or the normal memory cell array 106 in response to the output of the corresponding k-bit decoder 341, 342 or 343. The k-bit decoders 341, 342 and 343 are enabled and disabled by both the row decoder disable signal PRRE output from the row decoder disable signal generator 310 and the delayed RASB signal RASBD output from the control signal generator 109.

Figure 5:
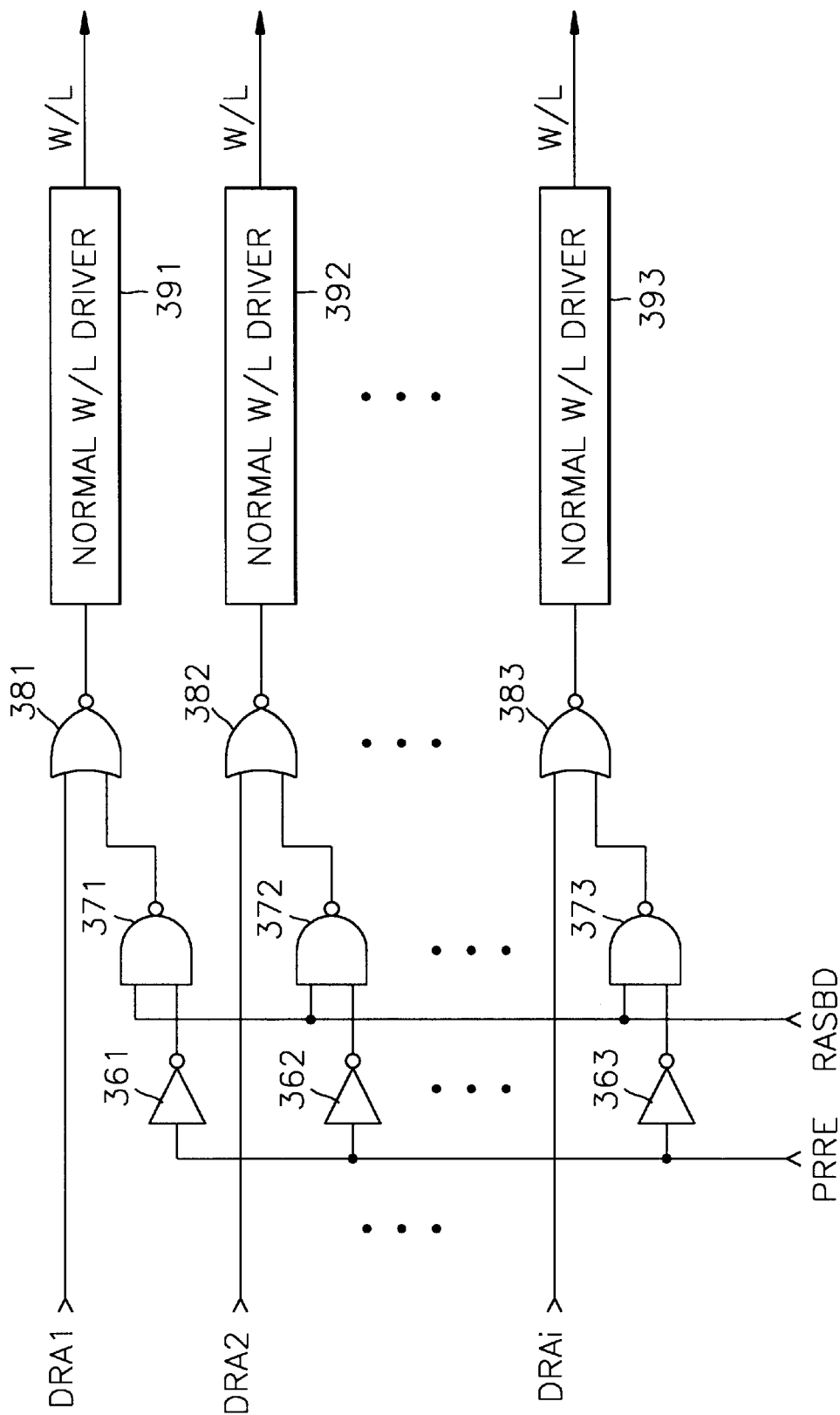
FIG. 5 is a circuit diagram of the normal word line control driving portion shown in FIG. 4.

FIG. 5 illustrates in greater detail the normal word line control driving portions 351, 352 and 353. Normal word line driver 351 includes logic gates 361, 371 and 381 which combine the PRRE signal, RASBD signal and DRA1 signal in order to control normal word line driver 391 that is coupled to a word line of normal memory cell array 106. Similarly, normal word line driver 352 includes logic gates 362, 372 and 382 to control normal word line driver 392 and normal word line driver 353 includes logic gates 363, 373 and 383 to control normal word line driver 393. Signals DRA1, DRA2, . . . , DRAi are the outputs of k-bit decoders 341, 342 and 343, respectively, which transition to an active logic "low" level in response to the input of the corresponding row address RA value. The row decoder disable signal PRRE, which is an active logic "high" level signal, is inverted by inverter 361 and input to NAND gate 371 which performs a NAND operation on the output of the inverter 361 and the control signal RASBD, which is an active logic "high" level signal. NOR gate 381 performs a NOR operation on the output signal DRA1 of the corresponding k-bit decoder and the output of the NAND gate 371 such that the output of the NOR gate 381 becomes active when the DRA1 signal is active, the control signal RASBD is active, and the row decoder disable signal PRRE is not active. The normal word line driver 391 activates the normal word line to which it is coupled when the output of NOR gate 381 is active.

Returning to FIG. 3, the redundant memory cell array 108 includes a plurality of redundant memory cells arranged in a matrix pattern. A redundant memory cell can be accessed by the combination of a redundant word line and a column, or bit, line. The redundant address for accessing the plurality of redundant word lines is not determined in the design step, but is specified in a repair step during manufacturing. Namely, the redundant memory cell array 108 is used to replace a defective memory cell in the normal memory cell array 106. The defective row address is assigned such that a redundant word line is activated by a defective row address.

Figure 6:
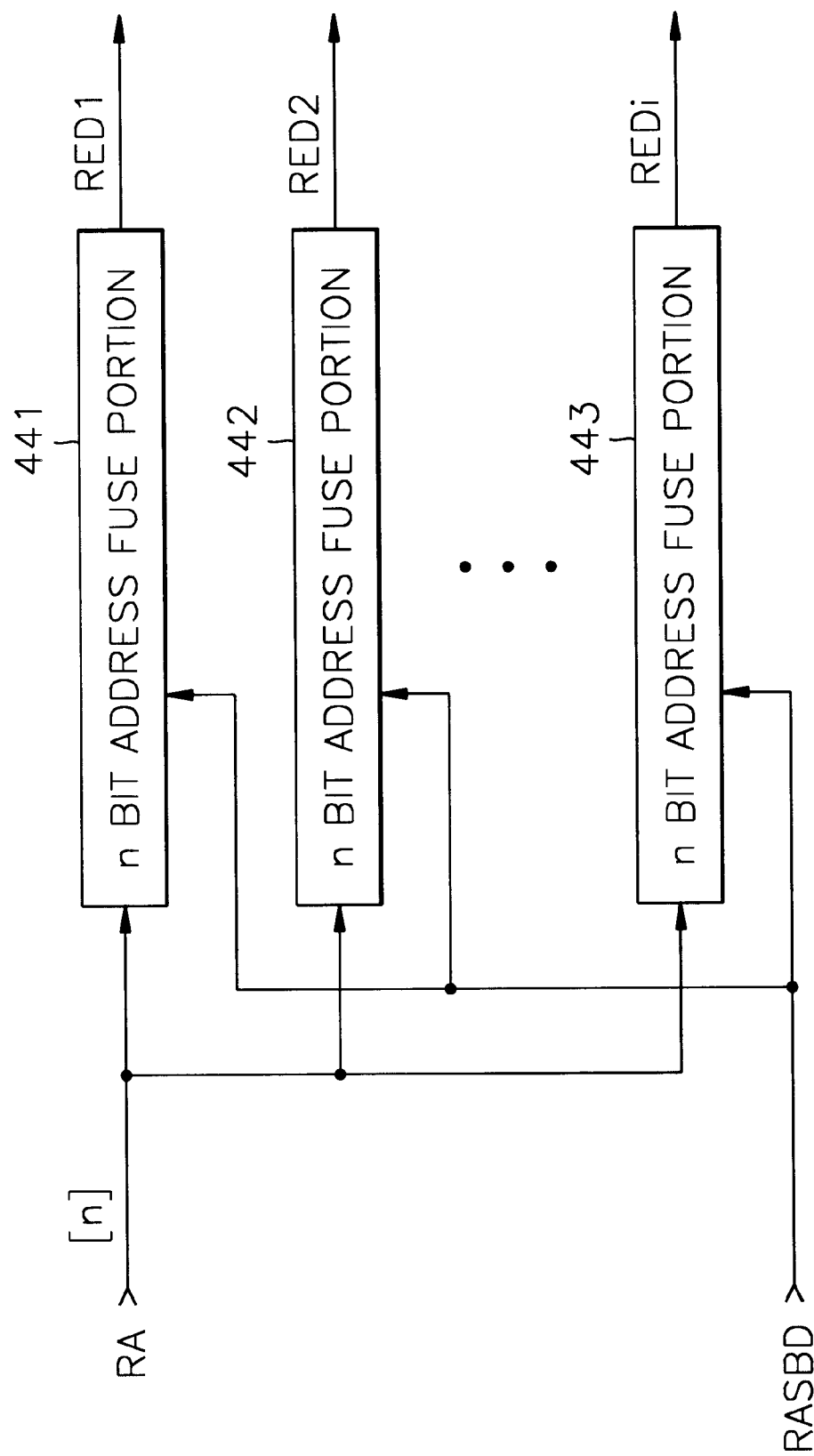
FIG. 6 is a block diagram of the redundant row fuse decoder shown in FIG. 3.

FIG. 6 shows the redundant row fuse decoder 320 of FIG. 3 which includes a plurality of n-bit address fuse portions 441, 442 and 443. The respective n-bit address fuse portions 441, 442 and 443 are coded with a defective row address assigned thereto. For example, if the row address (10010111000) corresponds to a first defective memory cell in the normal memory cell array 106, then n-bit address fuse portion 441 is coded with the defective row address (10010111000) such that n-bit address fuse portion 441 activates the RED1 output signal in responsive to a value for the RA signal of (10010111000). The n-bit address fuse portions 442 and 443 can be similarly coded with a defective memory address. The n-bit address fuse portions 441, 442 and 443 each include a plurality of fuses. The fuses in each n-bit address fuse portion are selectively shorted according to the bit values of the coded defective row address.

In the repair step for the conventional memory device, only m-bits of the n-bit row address, where m is less than n, are decoded in the fuse portions in order to decode a defective row address. In the present invention, however, all n bits of the row address are decoded in order to determine a defective row address. Therefore, the n-bit address fuse portions 441, 442 and 443 included in the redundant row fuse decoder 330 activate the signals RED1, RED2, . . . , REDi, respectively, when the delayed row address strobe signal RASBD is active and the value of the row address RA stored and output by row address buffer 101 coincides with a defective row address assigned to one of the n-bit address fuse portions.

Figure 7:
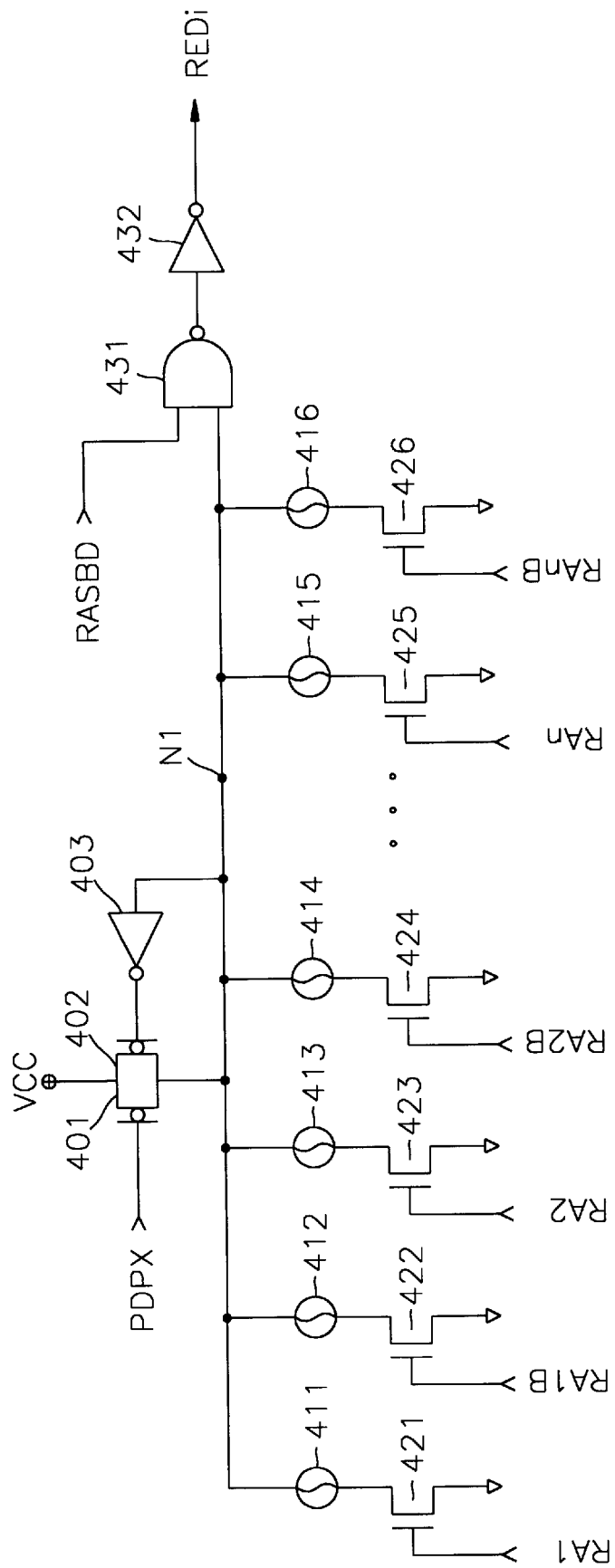
FIG. 7 shows an embodiment of the n-bit address fuse portion shown in FIG. 6.

FIG. 7 shows an embodiment of one of the n-bit address fuse portions 441, 442 or 443 shown in FIG. 6. A precharge control signal PDPX which is delayed for a predetermined time period from the point in time at which the row address strobe signal RASB becomes active at a logic "low" level. When the precharge control signal PDPX becomes active at a logic "low" level, node N1 is precharged to a power supply voltage VCC level. PMOS transistor 401 is turned on by the active low PDPX signal which drives node N1 to a logic high which is inverted by inverter 403. The low logic level signal output by inverter 403 drives PMOS transistor 402 which also charges the node N1. Each n-bit address fuse portion includes a plurality of fuses 411, 412, 413, 414, . . ., 415, 416 which are coded for a particular defective row address by being selectively shorted. The bit values RA1–RAn and inverted bit values RA1B–RAnB of the row address are applied to the gates of NMOS transistors 421, 422, 423, 424, . . . , 425, 426 in order to decode the defective row address determined by the pattern in which the fuses 411–416 are selectively blown.

Figure 11:
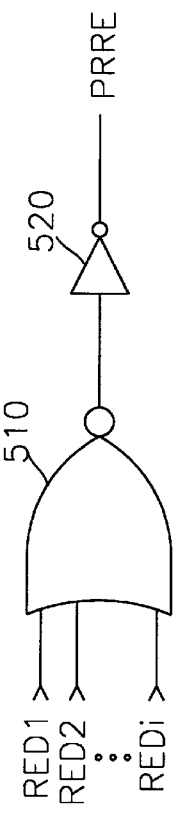
FIG. 11 is a circuit diagram showing an embodiment of the row decoder disable signal generator shown in FIG. 3.

When a defective row address is decoded, row decoder disable signal generator 310 of FIG. 3 outputs a row decoder disable signal PRRE in response to the output of one of the outputs RED1–REDi of the redundant row fuse decoder 320 becoming active. The circuit of the row decoder disable signal generator 310 can be implemented as a NOR gate 510 and an inverter 520, as shown in FIG. 11. Therefore, when the value of the externally input row address signal RA matches a defective row address coded into one of the n-bit address fuse portions 441, 442 or 443, one of the output signals RED1–REDi will become active which will consequently activate the row decoder disable signal PRRE. The row decoder disable signal PRRE will disable the row decoder 105 in order to prevent it from decoding the row address RA and activating the corresponding normal word line in the normal memory cell array 106. Instead, the row address RA is decoded by the redundant row fuse decoder and a word line in the redundant memory cell array 108 is activated. Therefore, the read/write operation for the particular row address RA value is performed in the redundant memory cell array 108 instead of the normal memory cell array 106.

Figure 8:
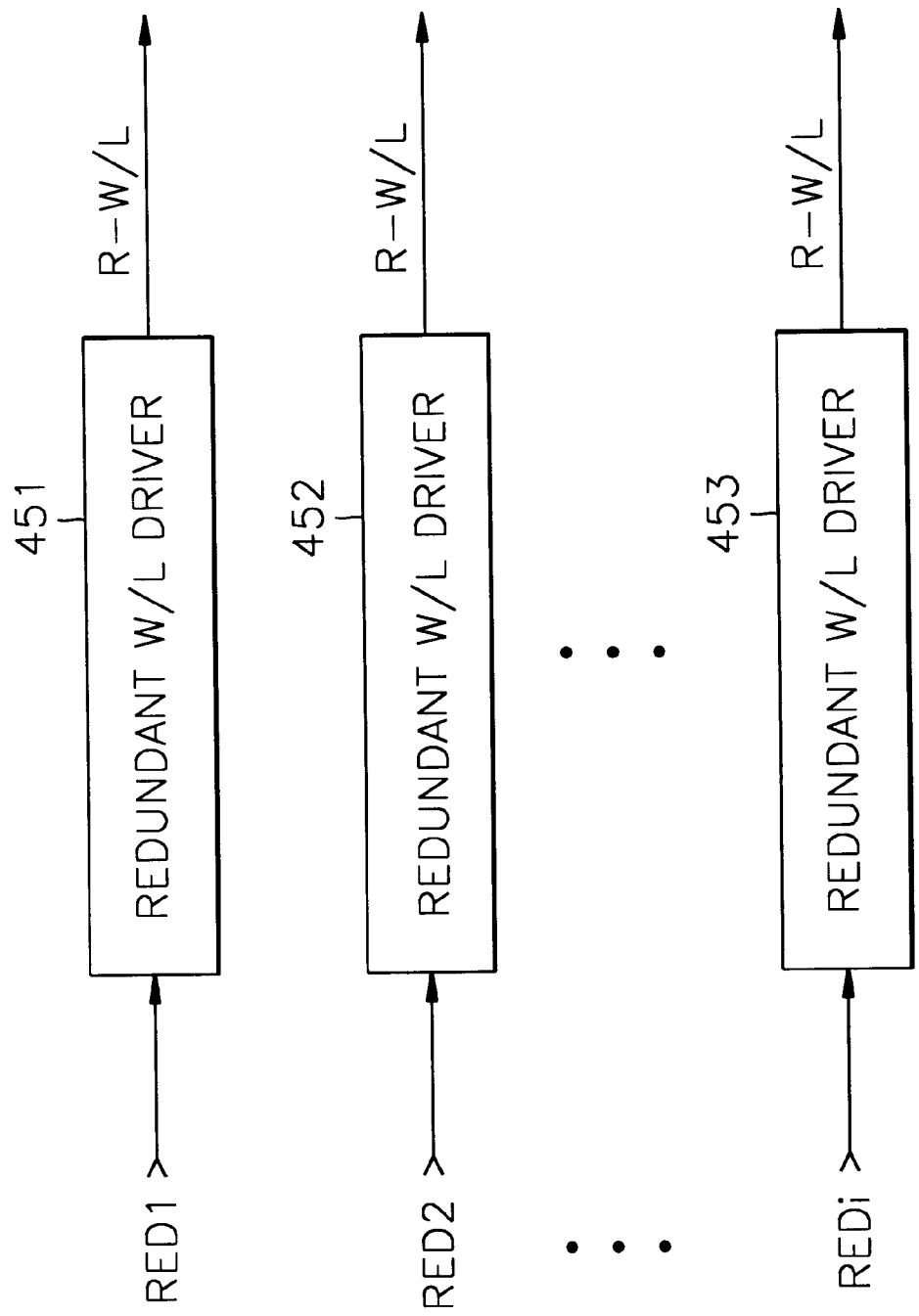
FIG. 8 is a block diagram of the control driving portion shown in FIG. 3.

FIG. 8 is a block diagram of the control driving portion 330 shown in FIG. 3 which includes a plurality of redundant word line driving portions 451, 452, . . . , 453. The redundant word line driving portions 451, 452, . . . , 453 activate the corresponding redundant word line R-W/L in the redundant memory cell array 108 when one of the output signals RED1, RED2, . . . , REDi of a corresponding redundant row fuse decoder is active.

Figure 1:
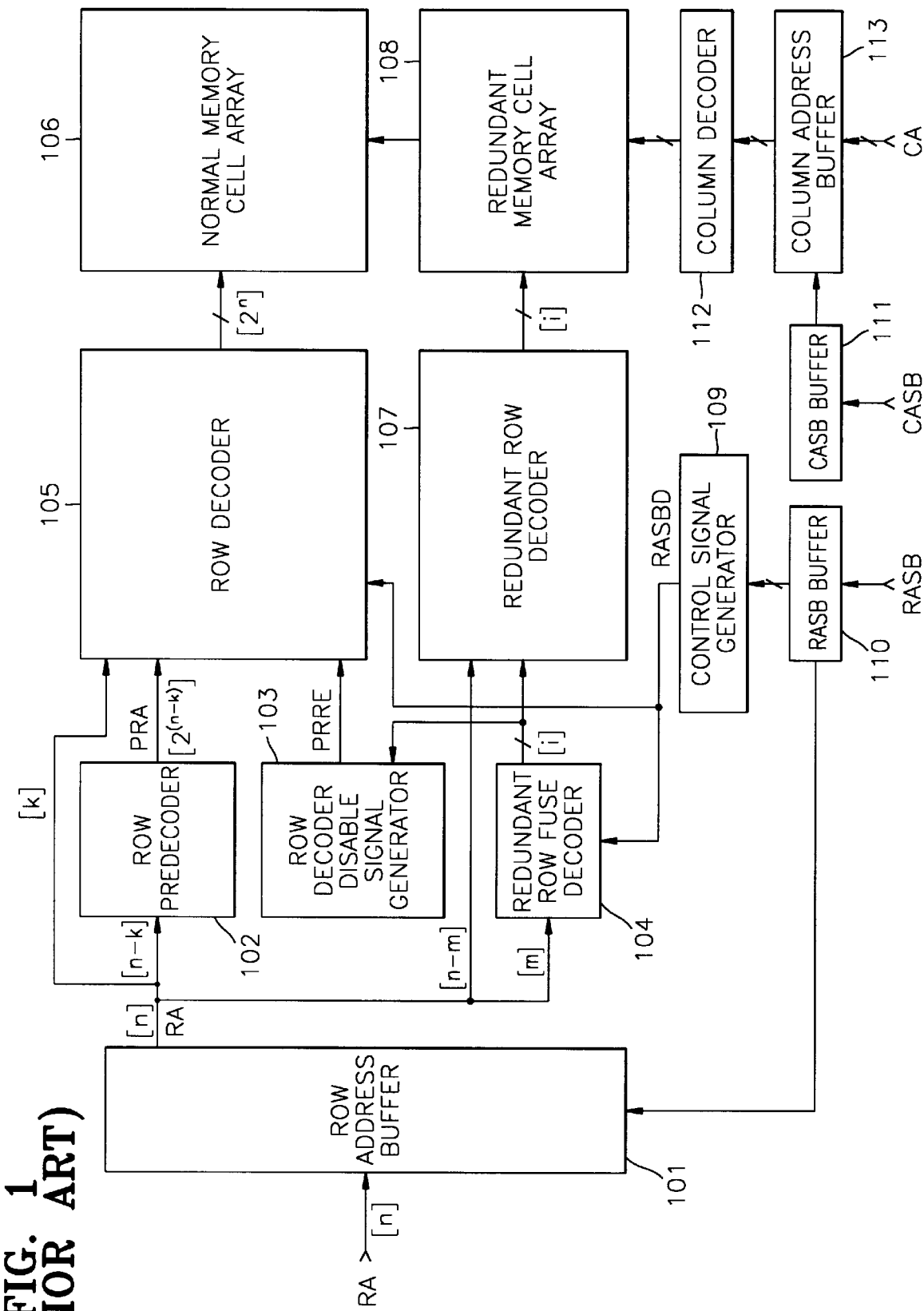
FIG. 1 is a block diagram of a conventional semiconductor memory device.
Figure 2:
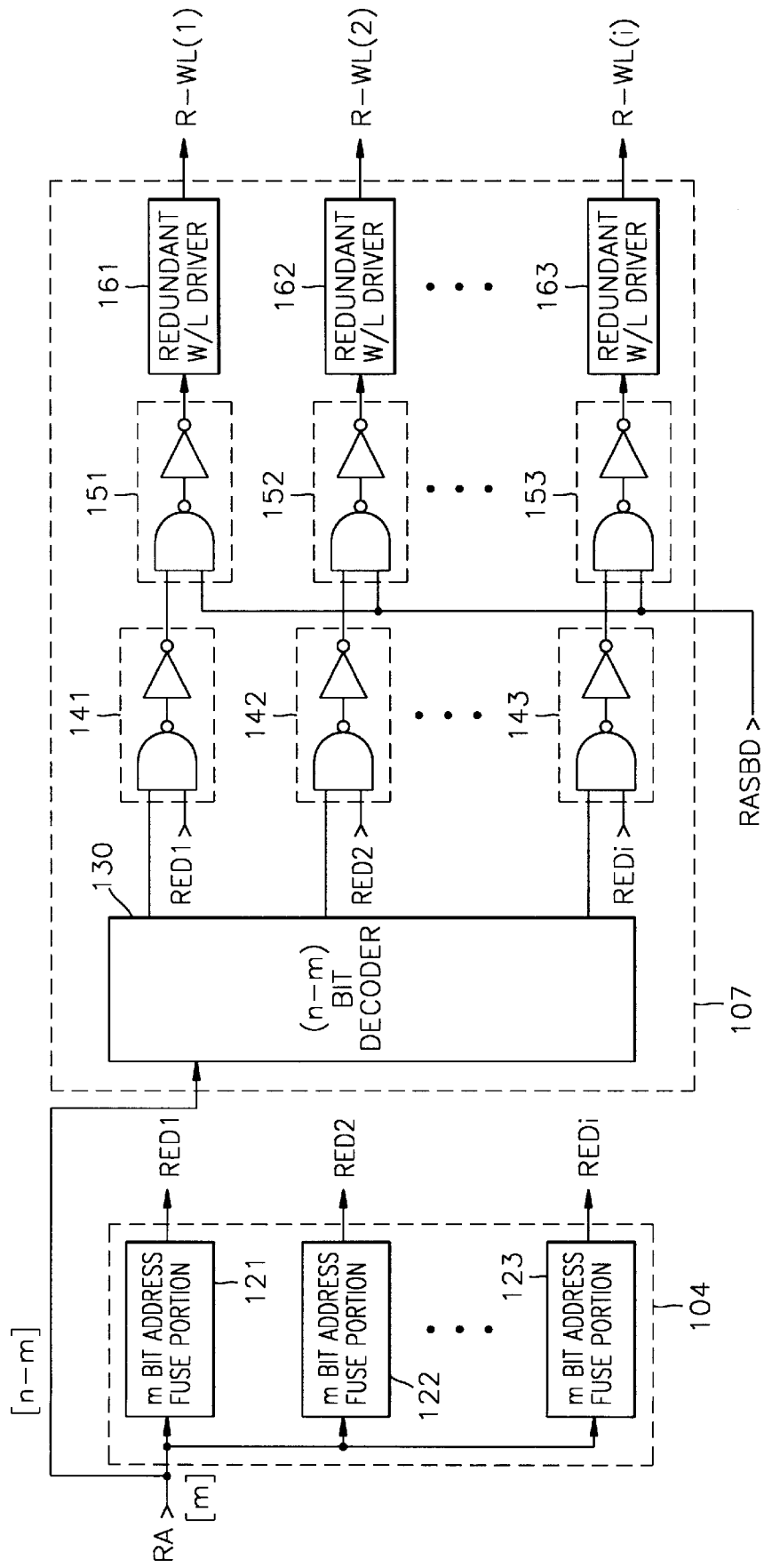
FIG. 2 is a block diagram of the redundant row fuse decoder and the redundant row decoder of FIG. 1.
Figure 9:
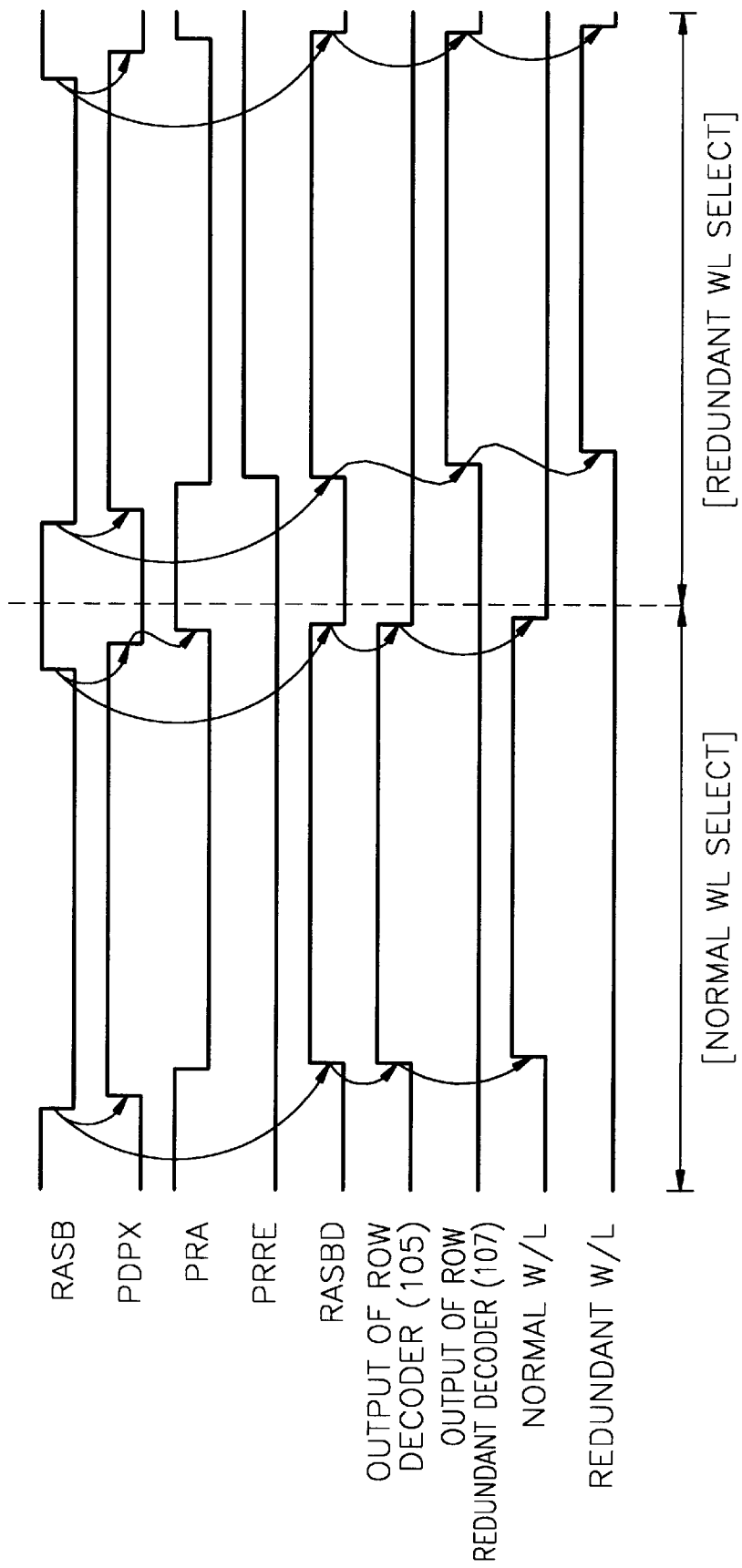
FIG. 9 is a waveform diagram showing the internal signals of the conventional semiconductor memory device of FIG. 1.

FIG. 9 shows the waveforms for the internal signals of the conventional semiconductor memory device of FIG. 1 relative to the externally input RASB signal. FIG. 9 shows both the case in which a normal word line is selected and the case in which a defective memory address is selected resulting in an access to the redundant memory cell array.

As described above, the row address strobe signal RASB becomes active at a logic "low" level, the precharge control signal PDPX is delayed for a predetermined amount of time before becoming active at a logic "high" level responsive to RASB becoming active, as indicated by the arrow from the falling edge of RASB to the rising edge of PDPX. Next, one of the output signals PRA1–PRAi from the row predecoder 102 becomes active at a logic "low" level, in response to the value of the row address signal RA, and selects one of the k-bit decoders 342–343 in row decoder 105. The row decoder disable signal PRRE remains inactive at a logic "low" level because the value of RA corresponds to a word line in the normal memory cell array 106. The control signal RASBD becomes active at a logic "high" level after a predetermined amount of time elapses after the falling edge of the row address strobe signal RASB. The output of the selected k-bit decoder 342–343 of row decoder 105 becomes active at a "high" level and activates the normal word line corresponding thereto. Since the output of the redundant row decoder 107 remains inactive at a "low" level, the redundant word lines remain inactive in a "low" level state.

FIG. 9 also illustrates the case in which a redundant word line is selected where the value of the row address RA input to the memory device corresponds to a defective row address. As in the normal row decode case, the row address strobe signal RASB drops to an active "low" level, the precharge control signal PDPX rises to an active "high" level, and the delayed RASB signal RASBD rises to an active "high" level. The output signal PRA1–PRAi from the row predecoder 102 corresponding to the value of the RA signal also drops to an active "low" level. However, the row decoder disable signal PRRE will rise to an active "high" level responsive to an active output signal from redundant row fuse decoder 104 to disable row decoder 105 such that the normal row word lines output from row decoder 105 remain at an inactive "low" level. At the same time, a redundant word line output from the redundant row decoder 107 will rise to an active "high" level to activate a redundant word line.

Figure 10:
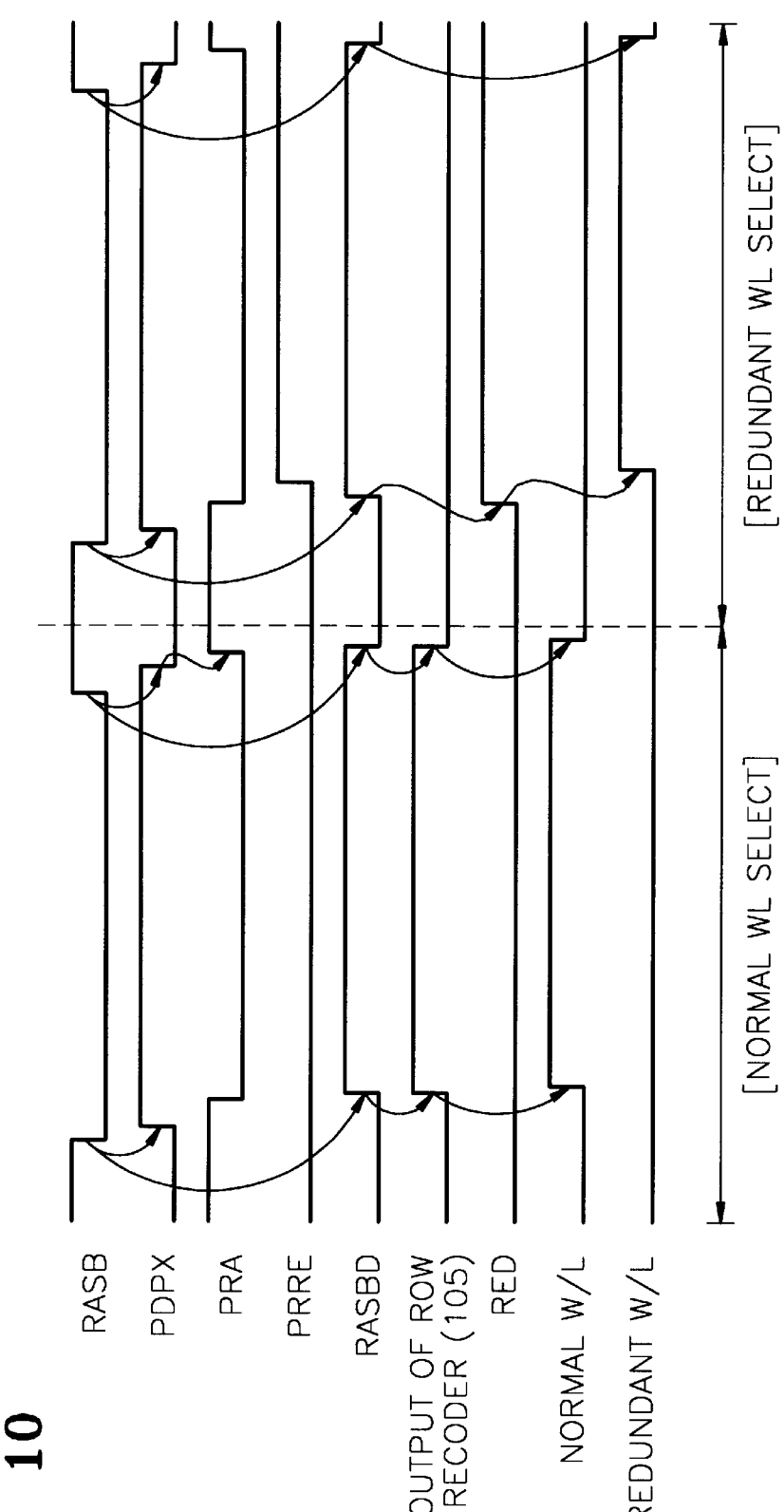
FIG. 10 is a waveform diagram showing the inner signals of the semiconductor memory device according to the present invention.

FIG. 10 shows the waveforms for the internal signals of the semiconductor memory device according to the present invention for both the case in which the normal word line is selected and the case where a redundant word line is selected. When a normal address is input via RA, the row address strobe signal RASB drops to an active "low" level, the precharge control signal PDPX rises to an active "high" level, and the delayed RASB signal RASBD rises to an active "high" level. One of the outputs PRA1–PRAi of the row predecoder 102 drops to an active "low" level and the row decoder disable signal PRRE remains inactive at a "low" level. The selected output PRA1–PRAi of the row decoder 105 rises to an "high" level in order to activate the corresponding normal word line to an active "high" level. At this time, all the output signals RED1–REDi of the redundant row fuse decoder 320 are in a "low" level non-active state. As a result, none of the redundant word lines are activated.

When a defective memory address in input via the RA signal, a redundant word line is selected. When the defective memory address in input, the row address strobe signal RASB drops to an active "low" level, the precharge control signal PDPX rises to an active "high" level, and the delayed RASB signal RASBD rises to an active "high" level after a predetermined delay. One of the outputs PRA1–PRAi from the row predecoder 102 will drop to an active "low" level. However, the row decoder disable signal PRRE will rise to an active "high" level in response to an active output signal RED1–REDi from the redundant row fuse decoder 320 which disable row decoder 105 causing the outputs of the row decoder 105 to remain at an inactive "low" level. As a result, none of the normal word lines are activated. However, when the delayed RASB signal RASBD rises to an active "high" level, the active output signal RED1–REDi from the redundant row fuse decoder 320 will activate the control driving portion 330 to drive the corresponding redundant word line.

The present invention is not restricted to the above embodiments, and it should be readily understood by one skilled in the art that many variations are possible which remain within the scope and spirit of the present invention.

The above-mentioned semiconductor memory device can be implemented with a simple circuit structure. Thus, it is possible to increase the operating speed and reduce the required layout area for the memory device.

What is claimed is:

1. A semiconductor memory device, comprising:

a normal memory cell array including a plurality of memory cells organized into $2^n$ word lines and a plurality of column bit lines;

a normal row address decoder configured to activate one of the word lines of the normal memory cell array responsive to an externally input n-bit row address signal, wherein the normal row address decoder is further configured to be inhibited from activating one of the $2^n$ word lines of the normal memory cell array responsive to a normal row decoder disable signal;

a redundant row fuse decoder including a plurality of n-bit address fuse portions wherein each one of the plurality of n-bit address fuse portions is configured to be coded to respond to an n-bit defective row address in the externally input n-bit row address signal corresponding to one of the $2^n$ word lines of the normal memory cell array and generate an redundant word line activation signal, and wherein the redundant row fuse decoder is further configured to generate the normal row decoder disable signal responsive to the redundant word line activation signal; and a redundant memory cell array including a plurality of redundant rows of memory cells specified by a redundant word line and the plurality of column bit lines, wherein each one of the redundant rows of memory cells is configured to receive the redundant word line activation signal generated by one of the n-bit address fuse portion of the redundant row fuse decoder.

2. The semiconductor memory device of claim 1, wherein the normal row address decoder further comprises:

a predecoder for decoding (n-k) higher order bits of the externally input n-bit row address signal and activate one of $2^{(n-k)}$ preliminary row address signals responsive thereto;

a row decoder including a plurality of k-bit row decoders, each one of the plurality of k-bit row decoders being configured to receive one of the $2^{(n-k)}$ preliminary row address signals and, responsive thereto, decode the lower order k bits of the externally input n-bit row address signal in order to activate one of the $2^n$ word lines of the normal memory cell array, wherein the plurality of k-bit row decoders are inhibited from activating one of the $2^n$ word lines of the normal memory cell array responsive to the normal row decoder disable signal.

3. A method for replacing defective memory cells in a normal memory cell array having $2^n$ rows, the method including:

providing a redundant memory cell array;

specifying a predetermined n-bit defective row address by selectively blowing fuses in an n-bit redundant row address decoder;

decoding the predetermined n-bit defective row address from an externally input n-bit row address signal;

disabling activation of the rows of the normal memory cell array responsive to decoding the predetermined n-bit defective row address from the externally input n-bit row address signal; and activating a row of the redundant memory cell array responsive to decoding the predetermined n-bit defective row address from the externally input n-bit row address signal.

4. The method of claim 3, wherein the step of decoding the predetermined n-bit defective row address from an externally input n-bit row address signal includes:

precharging a circuit node responsive to a row address strobe signal;

providing a first plurality of transistors coupled in series with a first plurality of fuses, wherein each one of the first plurality of transistors is driven by one of the n-bits of the externally input row address signal; and providing a second plurality of transistors coupled in series with a second plurality of fuses, wherein each one of the second plurality of transistors is driven by an inverted one of the n-bits of the externally input row address signal.

5. The method of claim 4, wherein the step of specifying a predetermined n-bit defective row address by selectively blowing fuses in an n-bit redundant row address decoder further includes selectively blowing ones of the first and second plurality of fuses to specify the predetermined n-bit defective row address.

6. A semiconductor memory device, comprising:

a normal memory cell array including a plurality of memory cells specified by $2^n$ word lines and a plurality of bit lines in response to an input n-bit row address;

a redundant row fuse decoder including a plurality of n-bit address fuse portions which are coded according to an n-bit defective row address corresponding to a memory cell in which defects are generated in the normal memory cell and outputs a signal which becomes active when a row address input from outside coincides with the coded defective address; and a redundant memory cell array including a plurality of memory cells specified by a redundant word line and a plurality of bit lines which are driven by the output of the n-bit address fuse portions.

7. A semiconductor memory device as claimed in claim 1, further comprising:

a predecoder for predecoding and outputting some of the row addresses;

a row decoder disable signal generating portion for generating a row decoder disable signal PRRE which becomes active when one of the outputs of the redundant row fuse decoder is active; and a row decoder for decoding the rest of the row addresses having its output disabled when the row decoder disable signal is active.

* * * * *